United States Patent [19]

Lambourn et al.

[11] Patent Number: 4,484,299

[45] Date of Patent: Nov. 20, 1984

[54] DIGITAL FILTER ARRANGEMENT HAVING MEMORY MEANS WITH ADDRESSABLE WORDS STORED THEREIN

[75] Inventors: Edward H. Lambourn, Enfield; Gideon A. Senensieb, Barnet, both of England

[73] Assignee: International Standard Electric Corporation, New York, N.Y.

[21] Appl. No.: 356,584

[22] Filed: Mar. 9, 1982

[30] Foreign Application Priority Data

Mar. 12, 1981 [GB] United Kingdom ............... 8107765

[51] Int. Cl.³ .......................................... G06F 15/31
[52] U.S. Cl. .................................................. 364/724
[58] Field of Search ........................ 364/724; 333/166

[56] References Cited

U.S. PATENT DOCUMENTS 4,146,931 3/1979 Delforge .............................. 364/724
4,374,426 2/1983 Burlage et al. ...................... 364/724

OTHER PUBLICATIONS

Schröder, "High Word-Rate Digital Filters with Programmable Table Look-Up" *IEEE Trans. on Circuits & Systems* vol. CAS-24, No. 5, May 1977, pp. 277-279.
Peled et al., "A Now Hardware Realization of Digital Filters" *IEEE Trans. on a Coustics, Speech & Signal Processing* Assp-22, No. 6, Dec. 1974, pp. 456-462.

Primary Examiner—David H. Malzahn
Attorney, Agent, or Firm—John T. O'Halloran; Alfred C. Hill

[57] ABSTRACT

A digital filter arrangement in which an input pulse stream is entered in consecutive non-overlapping groups into a first shift register. The contents of the first register are transferred in parallel into a plurality of shift registers. Bits are read-out from selected positions of the plurality of shift registers to form address words for individual read-only memories (ROM). Each ROM has stored therein weighted impulse response outputs which are read out in accordance with the address words. The outputs from the ROM's are added in logic circuitry and the combined output is fed into a latch. The contents of the latch are entered into a buffer from where they are read out serially. If the input clock rate is 28 MHz and the plurality of shift registers number eight, the plurality of shift registers, the ROM's and the logic circuitry operate at 3.5 MHz.

23 Claims, 3 Drawing Figures

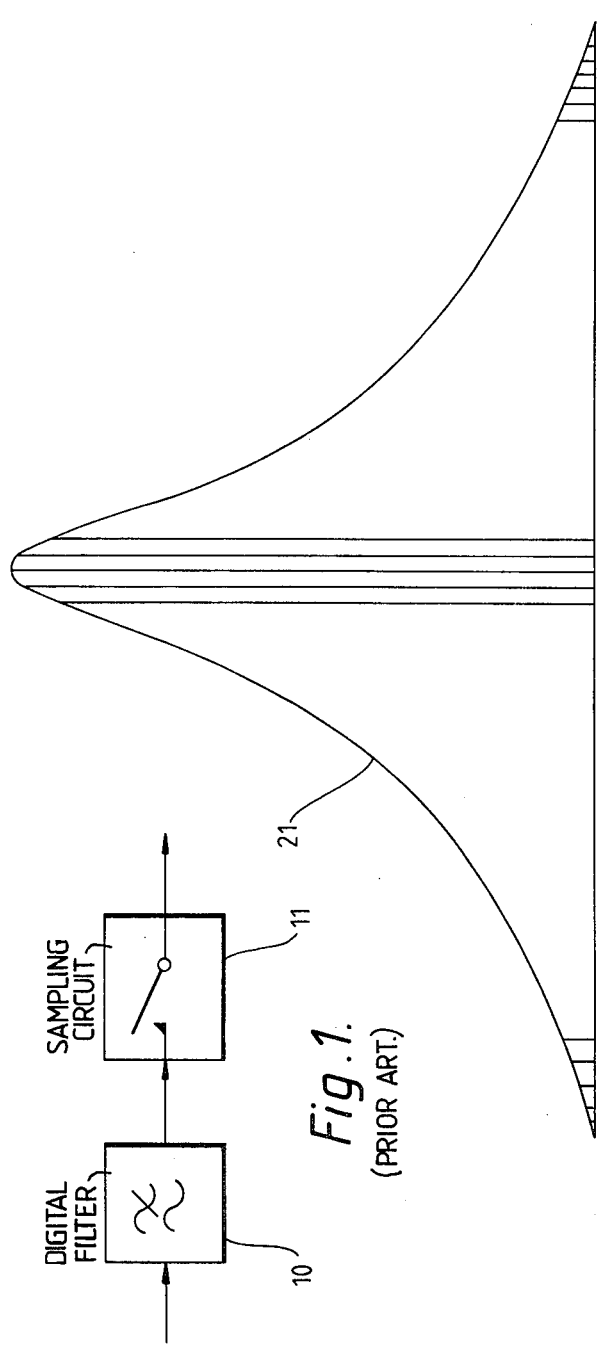
Fig. 1. (PRIOR ART.)
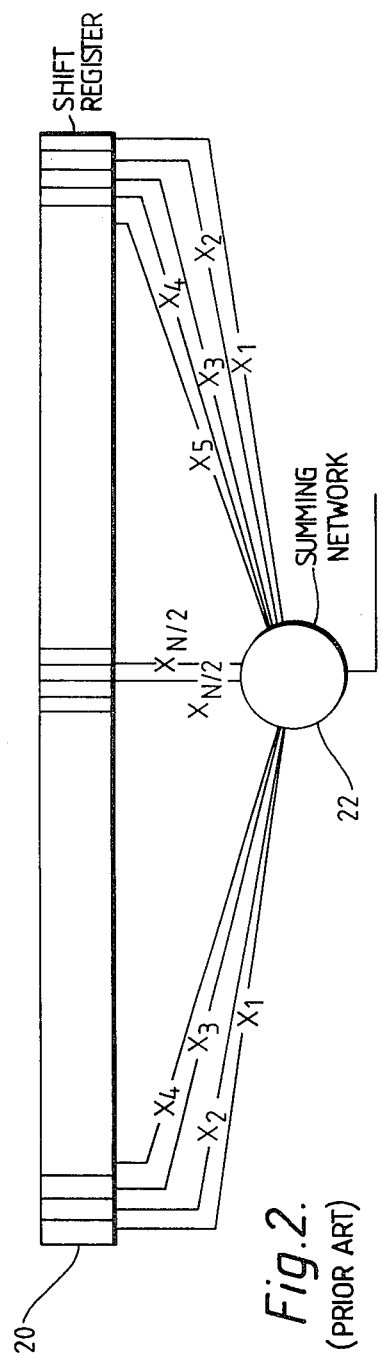
Fig. 2. (PRIOR ART)

DIGITAL FILTER ARRANGEMENT HAVING MEMORY MEANS WITH ADDRESSABLE WORDS STORED THEREIN

BACKGROUND OF THE INVENTION

The present invention relates to a digital filtering arrangement and is particularly suited for use in a high speed pulse density modulation to pulse code modulation translation equipment.

British Pat. No. 1,436,878 discloses a pulse density modulation (PDM) to pulse code modulation (PCM) translation arrangement comprising a digital filter to which a PDM signal is applied and logic means to which the output of the filter is applied, the logic means being arranged to select every mth group of n pulses in the digital filter output. Typically the translation arrangement can be depicted schematically as shown in FIG. 1. A PDM signal, which is a continuous stream of binary pulses or bits is applied to a digital filter 10 which is constructed to suppress, as far as possible, high frequency noise. The filtered signals are then applied to a sampling circuit 11 which effectively selects every mth group of n pulses. For example, consider a system in which the PDM rate is 8.064 Mb/s (megabits per second). After filtering this can be regarded as an arbitrary stream of 14-bit words with a word rate of 8.064 Mw/s (megawords per second). If now every 504th 14-bit word is selected, the output becomes a PCM signal of 16 Kw/s (kilowords per second).

Such an arrangement is suitable for a speech channel of 0-4 KHz (kilohertz) bandwidth. The basic rate clock would not be expected to exceed a nominal 8 MHz (megahertz). However, a channel of 56-112 KHz bandwidth as required for frequency division multiplex (FDM) analog-to-digital (A/D) conversion, or 0-50 KHz for a possible music A/D, would need a basic clock rate of about 56 MHz (i.e. this is the presently used 4 MHz for speech scaled up by a factor of 14) and there is a technology problem when working at this speed. In particular the power consumption of integrated circuits becomes unacceptable.

The basic principles of a digital filter coupled with selective logic can be explained with reference to FIG. 2. An N-bit shift register 20 has N tap outputs, each tap output having an individual weighting function X applied thereto. Thus the output of tap 1 is weighted by the function $X_1$, that of tap 2 by $X_2$ and so on. For example, if the weighting functions are generally increasing up to tap N/2 and then decreasing, the filter can have an impulse response as indicated by the curve 21 in FIG. 2. The outputs of all the taps are summed in network 22. Now, if the delay between each tap is T equal to $1/f_c$, where $f_c$ is the basic input clock frequency, and the total length of the filter is $f_s = NXT$. If the output of the filter is sampled at a frequency of $f_c/NT$, then the filter will receive a new set of data during each period and each bit will be uniquely weighted by only one of the respective tap weights according to its position in the time sequence. However, if the sampling rate is required to be four times $f_s$ each bit will be successively weighted by four separate weights during its progress through the filter. This weighting would normally occur at the prevailing basic clock frequency.

SUMMARY OF THE INVENTION

An object of the present invention is to provide an improved digital filter arrangement for a serial pulse stream.

A feature of the present invention is the provision of a digital filter arrangement for a serial pulse stream comprising a plurality of shift registers operating in parallel; each of the plurality of shift registers having pulses read out in parallel from selected positions thereof, predetermined combinations of the pulses read out of the plurality of shift registers providing a plurality of address words; first means coupled to the plurality of shift registers to distribute pulses of the pulse stream into the plurality of shift registers sequentially and cyclically; addressable memory means coupled to the plurality of shift registers, the memory means having a plurality of storage locations each having stored therein a digital word, the memory means providing in a non-volatile manner the digital word of each of the plurality of storage locations in response to associated ones of the plurality of address words; and logic means coupled to the memory means for providing a serial output of the digital words read out of the plurality of storage locations.

In a preferred embodiment of the invention the memory means comprises a plurality of separate memories, one for each of the plurality of shift registers, each separate memory having a number of storage locations addressable by the address words from the associated shift register only, and the logic means comprises means for adding the digital words read out of the separate memories once for each input cycle of the serial output.

BRIEF DESCRIPTION OF THE DRAWING

Above-mentioned and other features and objects of this invention will become more apparent by reference to the following description taken in conjunction with the accompanying drawing, in which:

FIG. 1 is a block diagram of a prior art PDM to PCM translation arrangement described hereinabove under the heading "Background of the Invention";

FIG. 2 is a block diagram and impulse response of a basic digital filter described hereinabove under the heading "Background of the Invention"

DESCRIPTION OF THE PREFERRED EMBODIMENT

Figure 3:
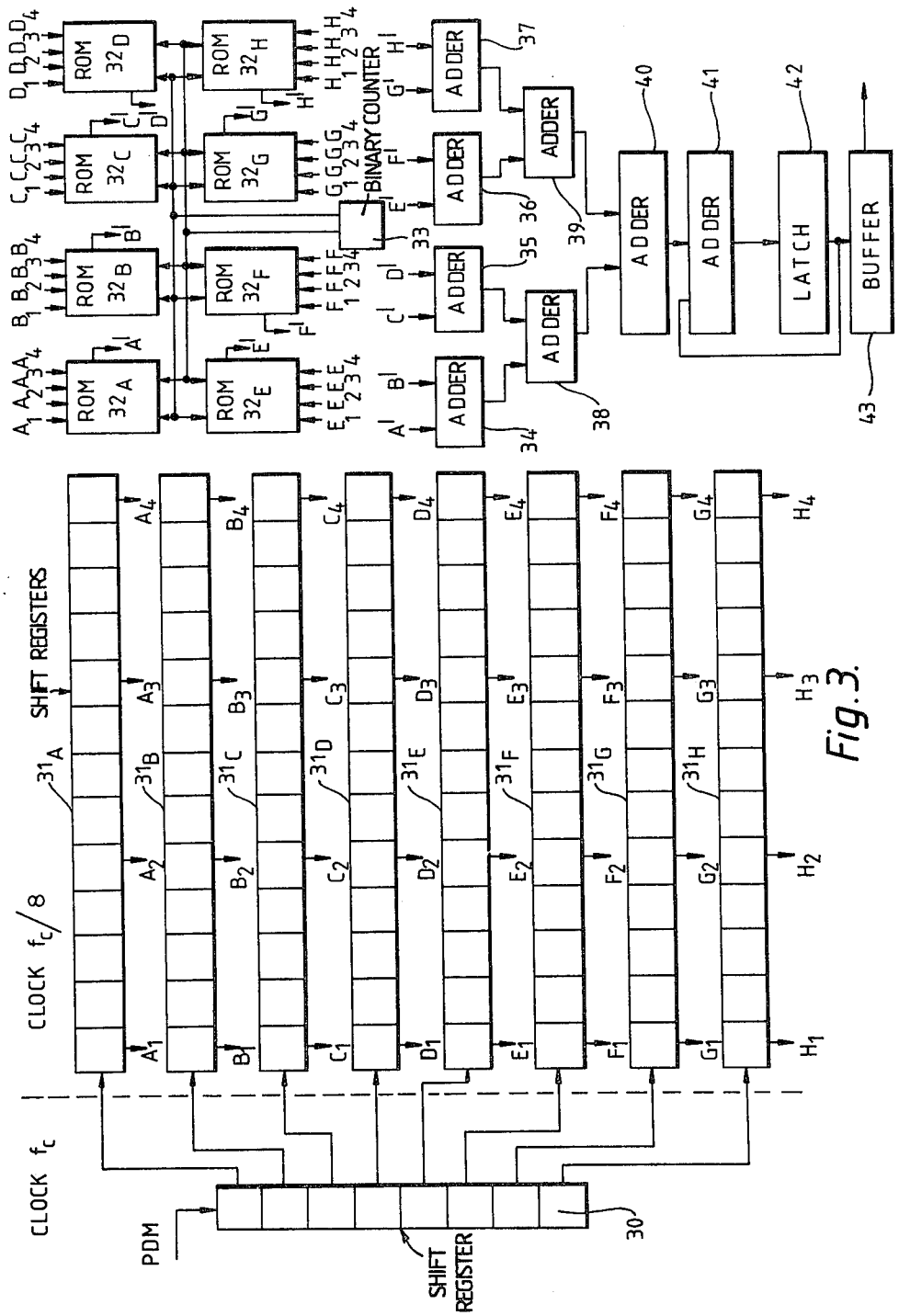
FIG. 3 is a block diagram of a digital filter arrangement according to the principles of the present invention.

In the block diagram of the digital filter arrangement shown in FIG. 3 an input PDM stream is entered serially into an 8-bit shift register 30. After each consecutive non-overlapping group of 8 bits has been entered, the contents of shift register 30 are transferred in parallel to eight further shift registers $31_A$-$31_H$, one bit to each of the further shift registers. The eight further shift registers $31_A$-$31_H$ are each operated at a clock rate which is 1/8th of the PDM input clock rate. Selected stages of each of the further shift registers are read out in parallel to form address words for a set of read-only memories (ROM) $32_A$-$32_H$. In the example shown, four equally spaced bits $A_1$—$A_4$, $B_1$—$B_4$, etc. Each ROM carries pre-stored weighted outputs which are read-out in accordance with the address words received from the shift registers $31_A$-$31_H$. Thus, each input bit of the PDM stream will pass through the filter in the period equal to p times $8/f_c$, where p is the number of stages in the shift registers $31_A$-$31_H$, and during this period it will be sampled and weighted four times. This agrees generally with the previously described requirements. Each ROM is also addressed by two bits from a common 2-bit binary counter 33. Hence, each ROM contains sixty-four digital words which represent all possible combinations from each of the respective shift registers $31_A$-$31_H$.

The outputs A', B' . . . H' of the separate ROM's are added in adders 34-37 and then in adders 38-39 and lastly in adder 40. The output of adder 40 is fed into a latch 42 via adder 41. Adder 41 and latch 42 together make an accumulator from which a parallel transfer is made into a buffer 43. The contents of buffer 43 are read-out serially at four times the repetition period $f_s$ of the filter to provide the PCM serial bit stream.

It is to be noted that the detail arrangement of FIG. 3 is by way of example only. Thus, the method of distribution of the incoming PDM signals need not necessarily be by a shift register. The eight shift registers $31_A$-$31_H$ can be scanned sequentially and the incoming bits being read, one at a time, into the relevant shift register. Also, the particular arrangement of memories and the method of addressing them can be different. Having one memory per shift register as shown is convenient but other arrangements are possible. For example, at one extreme a single large memory could be envisaged, with all the selected bits in the shift registers being combined to form a single address word. This arrangement would have the advantage that no adders would be required but it would have disadvantages in the size of and operation of the ROM. Other various combinations of shift registers, tap and ROM connections can be used. Another example is where the ROM's may be used to store only the weights representing the impulse response of the filter, then it would then be necessary to use multipliers in conjunction with each shift register tap and add the results separately. This would need more adders besides introducing multipliers, but the ROM's could be reduced in size. Yet again, each address word could be formed from taps from more than one shift register. Thus, the address words in FIG. 3 could be for example, $A_1C_2E_3G_4$, $B_1D_2F_3H_4$, $A_2C_3E_4G_1$, and so on, or other combinations. Finally, although the memories in FIG. 3 have been referred to as read-only-memories (ROM) they could be, for example, random-access-memories (RAM) the contents of which can be readily altered when required, e.g. on a day-to-day basis.

While we have described above the principles of our invention in connection with specific apparatus, it is to be clearly understood that this description is made only by way of example and not as a limitation to the scope of our invention as set forth in the objects thereof and in the accompanying claims.

We claim:

1. A digital filter arrangement for a serial pulse stream having a given clock rate comprising:

a plurality of shift registers operating in parallel, each of said shift registers having pulses read out in parallel from selected positions thereof, predetermined combinations of said pulses read out of said plurality of shift registers providing a plurality of address words;

first means coupled to said plurality of shift registers to distribute individual pulses of groups of pulses of said pulse stream into different ones of said plurality of shift registers sequentially and cyclically to produce said plurality of address words;

addressable memory means coupled to said plurality of shift registers, said memory means having a plurality of storage locations each having stored therein a digital word, said memory means providing in a non-volatile manner said digital word of each of said plurality of storage locations in response to associated ones of said plurality of address words;

second means coupled to said memory means to sum said digital words read out of said plurality of storage locations; and logic means coupled to said second means for providing a serial output for said filter arrangement from said sum of said digital words read out of said plurality of storage locations.

2. An arrangement according to claim 1, wherein said memory means includes a plurality of separate memories, one for each of said shift registers, each of said memories having a number of storage locations addressable by address words only from the associated one of said plurality of shift registers, and said adder means includes second means for adding said digital words read out of all of said memories once for each cycle of said serial output.

3. An arrangement according to claim 2, wherein each of said memories is a read-only memory.

4. An arrangement according to claims 1, 2 or 3, wherein said pulses read out of said plurality of shift registers are read from corresponding positions in each of said shift registers.

5. An arrangement according to claim 4, wherein said first means includes an input shift register having one pulse position for each of said shift registers of said plurality of shift registers, and third means to transfer the contents of each pulse position of said input shift register in parallel to associated ones of said shift registers of said plurality of shift registers after each consecutive non-overlapping group of pulses of said pulse stream has been entered into said input shift register.

6. An arrangement according to claim 5, further including means to shift pulses in said plurality of shift registers therethrough at a clock rate equal to 1/n times said pulse stream clock rate, where n is equal to the number of said plurality of shift registers.

7. An arrangement according to claim 6, wherein said pulses read out of said plurality of shift registers are read from equally spaced selected positions in each of said shift registers of said plurality of shift registers.

8. An arrangement according to claim 7, wherein said selected positions include the first and last position of each of said shift registers of said plurality of shift registers.

9. An arrangement according to claim 4, further including means to shift pulses in said plurality of shift registers therethrough at a clock rate equal to 1/n times said pulse stream clock rate, where n is equal to the number of said plurality of shift registers.

10. An arrangement according to claim 9, wherein said pulses read out of said plurality of shift registers are read from equally spaced selected positions in each of said shift registers.

11. An arrangement according to claim 10, wherein said selected positions include the first and last position of each of said shift registers.

12. An arrangement according to claim 4, wherein said pulses read out of said plurality of shift registers are read from equally spaced selected positions in each of said shift registers.

13. An arrangement according to claim 12, wherein said selected positions include the first and last position of each of said shift registers.

14. An arrangement according to claims 1, 2 or 3, wherein
said first means includes an input shift register having one pulse position for each of said shift registers of said plurality of shift registers, and third means to transfer the contents of each pulse position of said input shift register in parallel to associated ones of said shift registers of said plurality of shift registers after each consecutive non-overlapping group of pulses of said pulse stream has been entered into said input shift register.

15. An arrangement according to claim 14, further including means to shift pulses in said plurality of shift registers therethrough at a clock rate equal to 1/n times said pulse stream clock rate, where n is equal to the number of said plurality of shift registers.

16. An arrangement according to claim 15, wherein said pulses read out of said plurality of shift registers are read from equally spaced selected positions in each of said shift registers of said plurality of shift registers.

17. An arrangement according to claim 16, wherein said selected positions include the first and last position of each of said shift registers of said plurality of shift registers.

18. An arrangement according to claims 1, 2 or 3, further including means to shift pulses in said plurality of shift registers therethrough at a clock rate equal to 1/n times said pulse stream clock rate, where n is equal to the number of said plurality of shift registers.

19. An arrangement according to claim 18, wherein said pulses read out of said plurality of shift registers are read from equally spaced selected positions in each of said shift registers.

20. An arrangement according to claim 19, wherein said selected positions include the first and last position of each of said shift registers.

21. An arrangement according to claims 1, 2 or 3, wherein
said pulses read out of said plurality of shift registers are read from equally spaced selected positions in each of said shift registers.

22. An arrangement according to claim 21, wherein said selected positions include the first and last position of each of said shift registers.

23. A method of filtering a serial digital pulse stream comprising the steps of
distributing pulses of said pulse stream sequentially and cyclically to a plurality of shift registers operating in parallel;
forming address words from pulses read out in parallel from selected positions in each of said shift registers;
reading contents of each storage location of an addressable memory in response to an associated one of said address words for each storage location;
summing said contents read out of said storage locations; and
serially outputting said sum of said contents read out of said storage locations.

* * * * *